US007116578B2

(12) United States Patent
Kanamori et al.

(10) Patent No.: US 7,116,578 B2
(45) Date of Patent: Oct. 3, 2006

(54) NON-VOLATILE MEMORY DEVICE AND DATA STORING METHOD

(75) Inventors: Motoki Kanamori, Tachikawa (JP); Takayuki Tamura, Higashiyamato (JP); Kenji Kozakai, Tachikawa (JP); Atsushi Shikata, Higashimurayama (JP); Shinsuke Asari, Akishima (JP)

(73) Assignees: Renesas Technology Corp., Tokyo (JP); Hitachi ULSI Systems Co., Ltd., Tokyo (JP)

( * ) Notice: Subject to any disclaimer, the term of this patent is extended or adjusted under 35 U.S.C. 154(b) by 0 days.

(21) Appl. No.: 10/796,995

(22) Filed: Mar. 11, 2004

(65) Prior Publication Data

US 2004/0174742 A1    Sep. 9, 2004

Related U.S. Application Data

(62) Division of application No. 10/082,310, filed on Feb. 26, 2002, now Pat. No. 6,731,537.

(30) Foreign Application Priority Data

Sep. 12, 2001    (JP)    ............... 2001-276000

(51) Int. Cl.
*G11C 14/00*    (2006.01)
*G11C 16/04*    (2006.01)
*G11C 7/10*    (2006.01)
*G11C 8/00*    (2006.01)
*G06F 13/00*    (2006.01)

(52) U.S. Cl. ............. 365/185.08; 365/185.11; 365/189.04; 365/189.05; 365/189.12; 365/230.03; 365/236; 365/239; 365/240; 711/103

(58) Field of Classification Search .......... 365/185.08, 365/185.11, 185.23, 189.04, 189.05, 189.12, 365/196, 230.03, 230.06, 230.08, 236, 239, 365/240, 220
See application file for complete search history.

(56) References Cited

U.S. PATENT DOCUMENTS

| 5,799,200 | A | * | 8/1998 | Brant et al. .............. 713/340 |
| 5,956,743 | A | * | 9/1999 | Bruce et al. ............. 711/103 |
| 5,987,573 | A | * | 11/1999 | Hiraka .................. 711/156 |
| 6,011,741 | A | | 1/2000 | Wallace et al. ........... 365/221 |
| 6,026,020 | A | | 2/2000 | Matsubara et al. .... 365/185.11 |
| 6,128,675 | A | * | 10/2000 | Ko ......................... 710/23 |
| 6,145,069 | A | | 11/2000 | Dye ...................... 711/170 |
| 6,421,279 | B1 | | 7/2002 | Tobita et al. ........ 365/189.01 |
| 6,549,974 | B1 | | 4/2003 | Kaki et al. ............. 711/103 |
| 6,744,652 | B1 | * | 6/2004 | Srinivasan et al. ......... 365/49 |
| 2001/0007533 | A1 | * | 7/2001 | Kobayashi et al. .... 365/185.11 |
| 2002/0051394 | A1 | | 5/2002 | Tobita et al. ............. 365/221 |
| 2002/0191442 | A1 | | 12/2002 | Kobayashi et al. .... 365/185.11 |

(Continued)

FOREIGN PATENT DOCUMENTS

JP    1-62687    3/1990

*Primary Examiner*—Amir Zarabian
*Assistant Examiner*—Ly Duy Pham
(74) *Attorney, Agent, or Firm*—Miles & Stockbridge PC (57) ABSTRACT

In a card storage device containing a non-volatile memory and a buffer memory, the buffer memory includes a plurality of banks. Data is transferred sequentially from a host CPU to the banks of the buffer memory, data is transferred to the non-volatile memory from a bank that becomes full, a write operation is started when one unit of data to be written into the non-volatile memory at a time has been transferred and, without waiting for the data to be written, the next write data is transferred from the host CPU to a bank from which write data has been transferred.

3 Claims, 11 Drawing Sheets

U.S. PATENT DOCUMENTS

2003/0046483 A1 3/2003 Moschopoulos ............ 711/103
2004/0024957 A1* 2/2004 Lin et al. .................... 711/103
2004/0172499 A1* 9/2004 Roohparvar ................ 711/103
2005/0086286 A1* 4/2005 Gatto et al. ................. 709/200

* cited by examiner

NON-VOLATILE MEMORY DEVICE AND DATA STORING METHOD

CROSS-REFERENCE TO RELATED APPLICATION

This application is a division of application Ser. No. 10/082,310 filed Feb. 26, 2002 now U.S. Pat. No. 6,731,537.

BACKGROUND OF THE INVENTION

The present invention relates to a technology that may be applied to a non-volatile storage device, for example, to a technology that may be applied to a non-volatile semiconductor memory such as a flash memory or a card storage device, such as a multimedia card or a smart media memory card, that contains such a non-volatile semiconductor memory.

Recently, a card storage device, called a memory card containing a non-volatile memory, such as a flash memory, that retains its storage data even after the power has been switched off, is widely used as a data storage medium for portable electronic apparatus such as a digital camera.

Unlike a volatile memory such as a RAM, a non-volatile memory requires a longer write time. To solve this problem, some memory cards that contain a non-volatile memory further contain a buffer memory including of a RAM with a memory amount smaller than that of the non-volatile memory. When storing data, write data transferred from an external host CPU is once transferred to this buffer memory and then sequentially transferred from this buffer memory to the non-volatile memory (for example, JP-A-2-62687 laid-open on Mar. 2, 1990).

Figure 10:
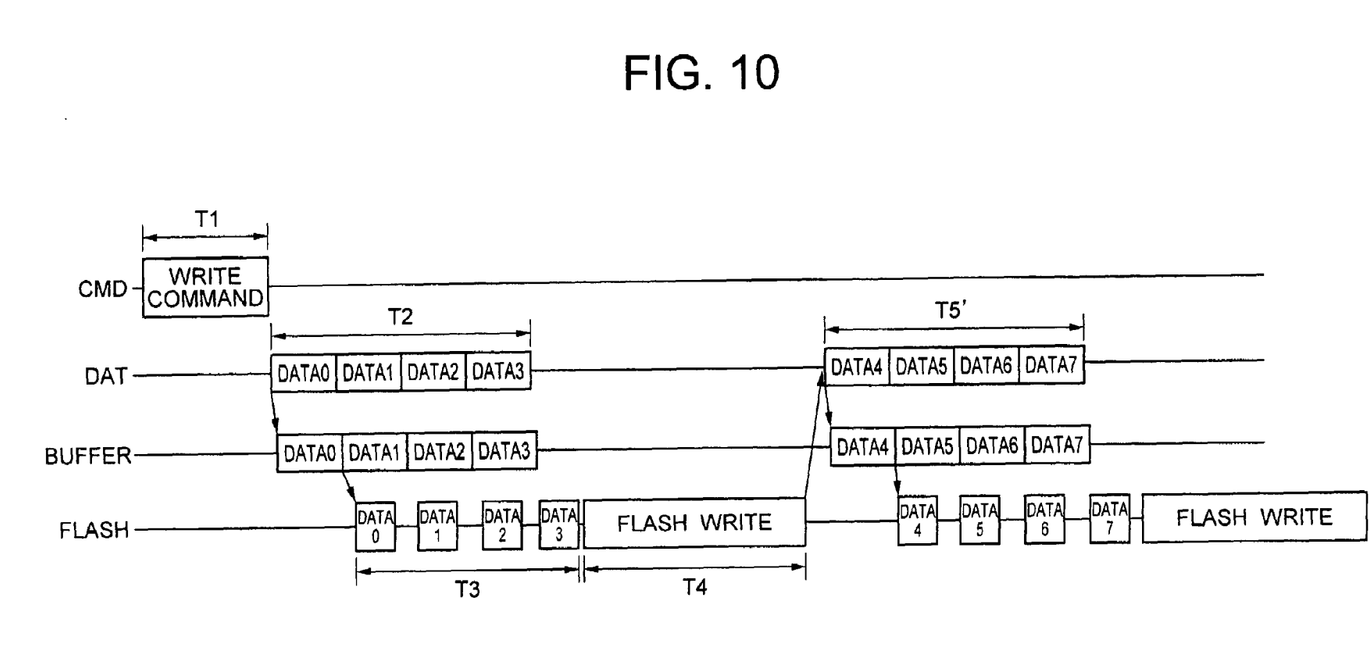
FIG. 10 is a timing diagram showing the timing of write processing on a conventional memory card.

However, a conventional memory card that contains a buffer memory transfers data as follows. That is, as shown in FIG. 10, a write command is sent during period T1 and a predetermined amount of write data is transferred from the host CPU to the buffer memory during period T2. Then, during period T3, one unit of data that is written at a time is transferred from the buffer memory to the non-volatile memory. On the other hand, after sending data DATA3, the host CPU stops data transfer to the buffer memory and waits until data is written in the non-volatile memory (period T4). Then, after confirming that data has been written on the memory card, the next write data is transferred from the host CPU to the buffer memory (period T5').

The advantage of this method is that, even if the write operation fails for some reason, the write data need not be transferred again from the host CPU to the memory card because the write data is retained in the buffer memory for period T4 during which the write data is written into the non-volatile memory. However, the problem with this method is that the overhead is large and that total write time is long because, for period T4 during which data is written into the non-volatile memory, data transfer to the buffer memory is suspended and the host CPU is put in the wait state and because the write operation of the non-volatile memory is also put in the wait state for the period during which the next data is transferred from the host CPU to the buffer memory.

SUMMARY OF THE INVENTION

It is an object of the present invention to provide a technology that reduces the write-data transfer overhead of a card storage device containing a non-volatile memory and a buffer memory to reduce the data write time.

The above-described objects and other objects, as well as the new features, of the present invention will be made more apparent by the detailed description and the accompanying drawings of this specification.

According to one aspect of the present invention, in a card storage device containing a non-volatile memory and a buffer memory, the buffer memory includes of a plurality of banks. Data is transferred sequentially from a host CPU to the banks of the buffer memory and data is transferred to the non-volatile memory from a bank that becomes full. The write operation is started when one unit of data to be written into the non-volatile memory at a time has been transferred and, without waiting for the data to be written, the next write data is transferred from the host CPU to a bank from which write data has been transferred.

According to the above aspect, data is transferred from the host CPU to the buffer memory concurrently with the data transfer from the buffer memory to the non-volatile memory. This method reduces the write data transfer overhead and greatly reduces the time required for writing data.

According to another aspect of the present invention, the card storage device further comprises a status register or a status flag indicating a completion/incompletion of the data transfer from the buffer memory to the non-volatile memory, wherein the status of the status register or the status flag are controlled by the controller. This configuration allows the host CPU to reference the status register or the status flag and to determine easily whether the next data may be transferred from the host CPU to the buffer memory.

According to another aspect of the present invention, the card storage device further comprises a first register containing information on a bank into which data is being entered from the external unit; and a second register containing information on a bank from which data is being transferred from the buffer memory to the non-volatile memory, wherein the controller judges the completion/incompletion of the data transfer to or from each bank, based on the bank information in the first register and the second register, to control the status register or the status flag. Alternatively, the card storage device further comprises a flag, for each bank, indicating whether or not the corresponding bank has data to be transferred to the non-volatile memory, wherein the controller judges the completion/incompletion of the data transfer to or from each bank, based on the flag status, to control the status register or the status flag. This configuration makes it easy to concurrently control the transfer of data from the buffer memory to the non-volatile memory and the transfer of data from the host CPU to the buffer memory.

Other objects, features and advantages of the invention will become apparent from the following description of the embodiments of the invention taken in conjunction with the accompanying drawings.

DETAILED DESCRIPTION OF THE EMBODIMENTS

Some preferred embodiments of the present invention will be described below with reference to the drawings.

Figure 1:
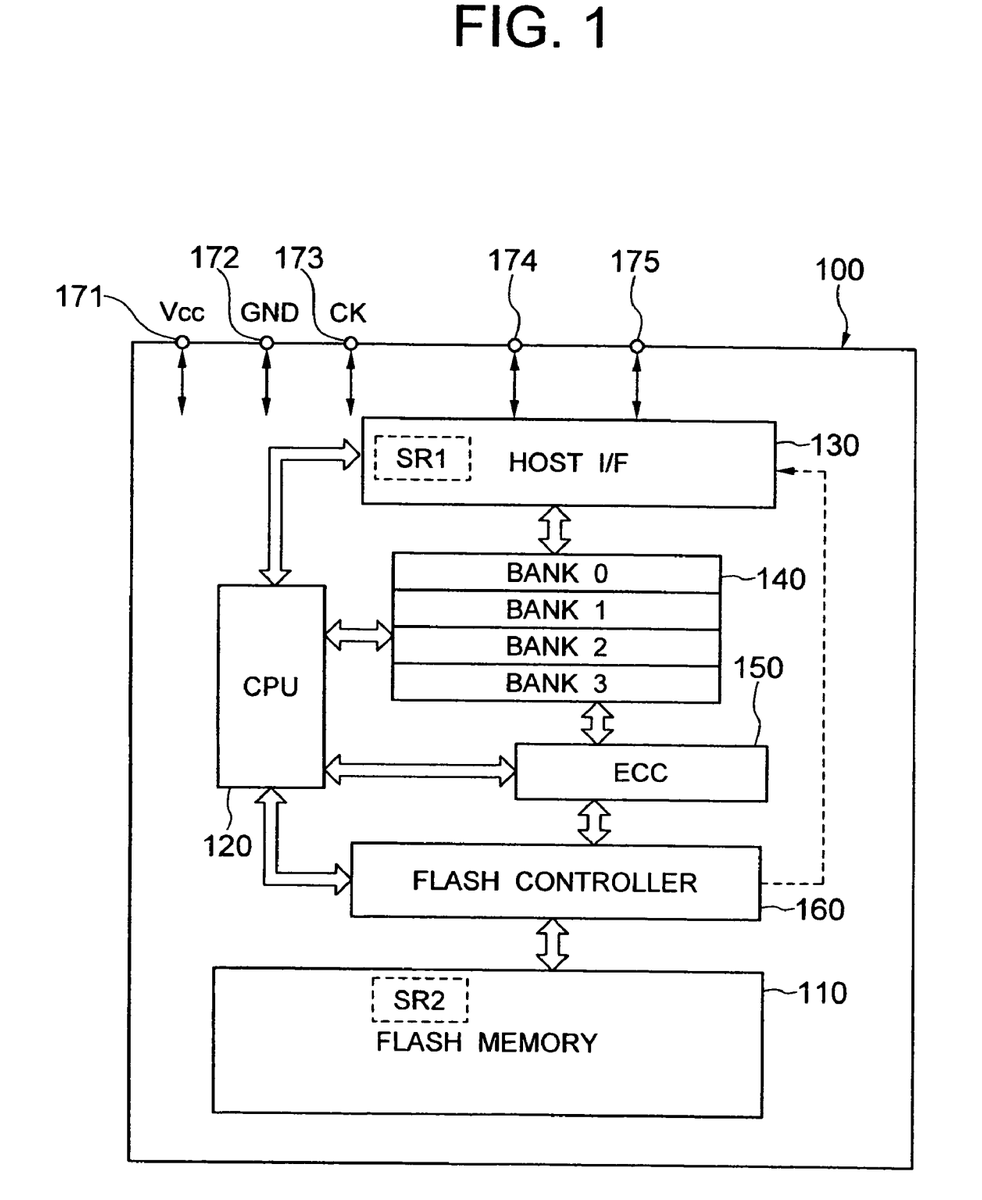
FIG. 1 is a block diagram showing an embodiment of a memory card containing a non-volatile memory to which the present invention is applied.

FIG. 1 shows an embodiment of a memory card containing a non-volatile memory according to the present invention.

Although not limited to this configuration, a memory card 100 in this embodiment comprises a flash memory (FLASH) 110 from which a predetermined amount of data may be electrically erased at a time, a microprocessor (CPU) 120 that controls the whole internal operations of the card, such as data transfer, based on externally supplied commands, an interface circuit 130 that transfers signals to and from external devices, a buffer memory 140, including of a RAM and so on, that stores write data sent from external devices and read data sent from the flash memory 110, an error-correction-code generation & error correction circuit 150 that generates an error correction code for write data and that checks and corrects read data based on the error correction code, and a flash controller 160 that controls writing data to and reading data from the flash memory 110 in response to an instruction from the CPU 120.

The components of the memory card, such as the memory 110, CPU 120, and flash controller 160, each including of a semiconductor integrated circuit. Those semiconductor integrated circuits, which are mounted on a printed circuit board, are molded with resin to form the memory card 100.

Also provided on the memory card 100 in this embodiment are external terminals 171–175 that are electrically connected to the circuit of an external electronic device when the memory card is inserted into the card slot of the external electronic device. The external terminals 171 and 172 are the power terminal and the ground terminal that are connected to the power potential Vcc and the ground potential GND, respectively. The external terminal 173 receives a clock signal CK used to time the operation. The external terminal 174 is a terminal through which a command or an address sent from an external host CPU to the card is input and through which the contents of the status register are output from the card to the host CPU. The external terminal 175 is a terminal through which write data sent from the external host CPU to the card is input and through which read data read from the card is output to the host CPU.

Signals are input and output from the external terminals 174 and 175 via the interface circuit 130. The buffer memory 140 comprises a plurality of banks. The bank specification signal and the read/write indication signal are supplied from the microprocessor 120 to the buffer memory 140. The bank status indication signal is supplied from the buffer memory 140 to the microprocessor 120. Write data transferred from the external host CPU is stored sequentially in the specified bank in the buffer memory 140 and, via the error-correction-code generation & error correction circuit 150, supplied to the flash memory 110. The microprocessor 120 converts a logical address entered from the external terminal 174 to a physical address and supplies the converted address to the flash memory 110 via the flash controller 160.

The synchronization clock SC is supplied from the microprocessor 120 to the error-correction-code generation & error correction circuit 150, and the signal indicating whether or not an error has been successfully corrected is supplied from the error-correction-code generation & error correction circuit 150 to the microprocessor 120. The interface circuit 130 includes a status register SR1 that contains an indicator indicating the status of the card, for example, whether or not write data has been transferred from the buffer memory 140 to the flash memory 110.

The status of the card is set in the status register SR1 by a signal from the microprocessor 120. The status bits of the status register SR1 include, for example, an error bit indicating that a write error has occurred, a ready/busy bit indicating that the card may be accessed, and an overflow bit indicating that the buffer memory 140 is full. In this embodiment, the contents of the status register SR1 may be read by a register read command, sent from the external host CPU, via the external terminal 174 via which the command is also input. The memory card may also be configured such that the status of the flash memory 110 is written directly into the status register SR1 by a signal sent from the flash controller 160.

The flash memory 110 comprises a memory array that is a matrix of non-volatile memory cells including of insulated-gate field effect transistors each with a floating gate, a word decoder that decodes an externally supplied address signal and activates the corresponding word line in the memory array to set it to the selection level, a data latch connected to the bit lines within the memory array to hold read/write data, and a boosting circuit that generates a high voltage required for writing and erasure.

In the flash memory in this embodiment, the data latch should be large enough to store data of one sector, that is, data of all memory cells connected to one word line. In addition, the flash memory 110 contains a status register SR2 that indicates whether data has been written normally or an error has occurred.

A flash memory, with a two-layer gate structure, stores data by taking advantage of a difference between the threshold voltage levels of the charge stored in the floating gate layer. In this embodiment, injecting electrons into the floating gate layer to increase the threshold voltage is called a write, and the reverse operation is called an erasure.

The flash memory used in the memory card in this embodiment is built such that it performs operation based on commands and control signals. Commands that may be issued to the flash memory include a read command, a write command, and an erase command. Control signals that are sent to the flash memory 110 include a chip select signal CE, a write control signal WE indicating whether the operation is a read operation or a write operation, an output control signal OE that indicates a time at which data is output, a system clock SC, and a command enable signal CDE that indicates which input has been received, command or address. Those commands and control signals are given by the flash controller 160.

The flash controller 160 has a control register. The microprocessor 120 sets up this control register to cause the flash controller 160 to control the operations, such as a write, read, and erase, to be performed for the flash memory 110. Signals supplied from the microprocessor 120 to the flash controller 160 include a control signal indicating which operation, read or write, is to be performed, an address signal specifying the control register and so on, and a data signal indicating data to be stored in the control register.

The configuration of a memory card on which a flash memory is mounted is not limited to that shown in FIG. 1. The memory card may use a flash memory that contains the error-correction-code generation & error correction circuit or may use a chip that combines the error-correction-code generation & error correction circuit with the controller. In addition, the flash memory 110 may be either a binary flash memory in which one-bit data is stored in one memory cell or a multi-valued flash memory in which multiple-bit data is stored in one memory cell by controlling the threshold voltage.

Furthermore, rather than mounting only one flash memory, multiple flash memories may be mounted. In that case, ECC circuits may be provided, one for each chip, or one ECC circuit may be shared among multiple flash memories. Although the memory card in this embodiment has two controllers, that is, microprocessor 120 and flash controller 160, the memory card may have only one of them.

Figure 2:
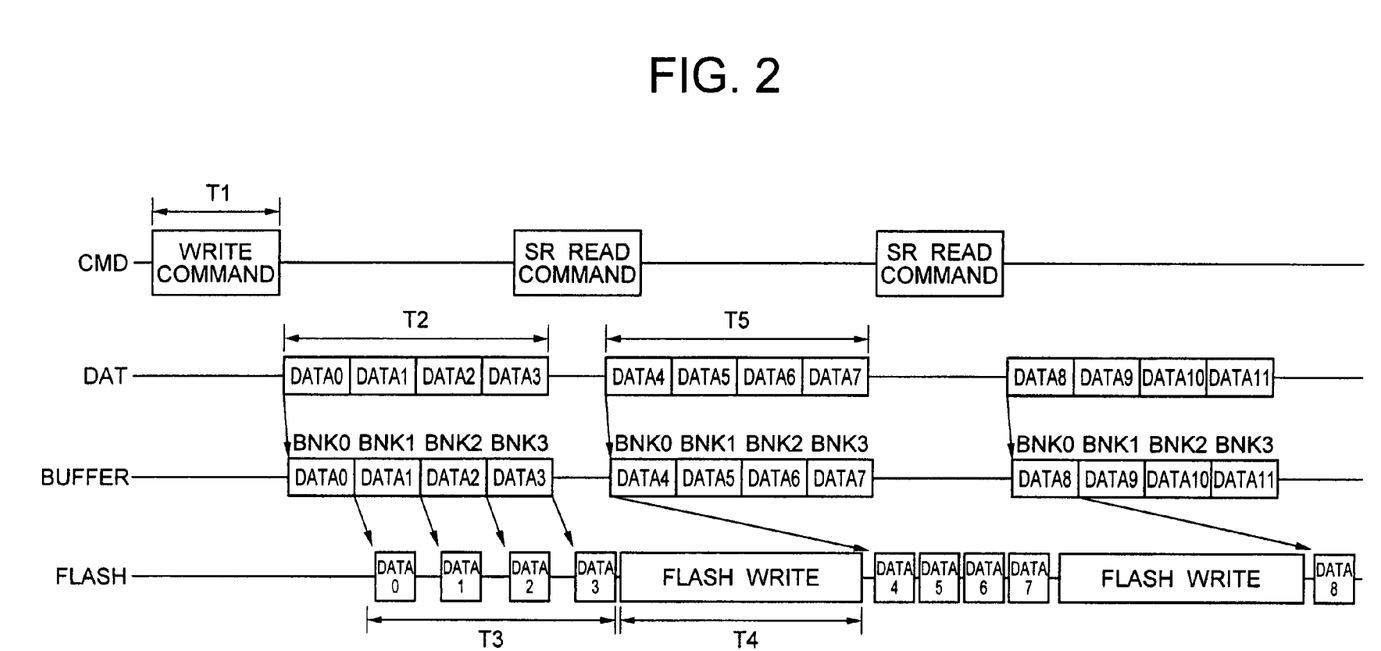
FIG. 2 is a timing diagram showing a first embodiment of write processing that is performed when the present invention is applied to the memory card in FIG. 1.

A first embodiment of the write data transfer method that is used when the present invention is applied to the memory card with the configuration described above will be described with reference to the timing diagram in FIG. 2. In the description below, the buffer memory 140 is assumed to include four banks, BNK0–BNK3, each with the capacity of 512 bytes.

In the first embodiment, when data is written in the memory card, a data transfer command and a write address are first sent from an external host CPU to the external terminal 174 of the memory card (period T1). Then, write data is transferred from the host CPU to the external terminal 175 of the memory card. The transferred data is stored sequentially into banks BNK0–BNK3 of the buffer memory 140 via the interface 130 (period T2). The transmission of the command and the address and the transfer of write data described above are performed serially.

Concurrently with the transfer of write data to the buffer memory 140 described above, write data is transferred from each bank to the flash memory 110 when each of banks BNK0, BNK1, BNK2, and BNK3 is filled with transfer data DATA0, DATA1, DATA2, and DATA3 each in 512 bytes (period T3). For example, when bank 0 is filled with transfer data DATA0, the transfer of the next data, DATA1, from the host CPU to bank BNK1 starts and, concurrently with this transfer, data is transferred from bank BNK0 to the flash memory 110.

Data is transferred from each bank to the flash memory 110 in parallel, for example, eight bits at a time. Therefore, for 512-byte data stored in one bank, the transfer of the data from the buffer memory 140 to the flash memory 110 is faster than the transfer of the data from the host CPU to the buffer memory 140. In addition, when transferred from the buffer memory 140 to the flash memory 110, write data goes through the error-correction-code generation & error correction circuit 150 to have an error correction code attached, one for each 512 bytes, before being supplied to the flash memory 110. When data has been transferred from banks BNK0–BNK3 to the flash memory 110, one sector of data is written into the flash memory 110 (period T4).

On the other hand, when all write data has been transferred from the buffer memory 140 to the flash memory 110 in this embodiment, the data in the buffer memory 140 is treated as unnecessary data. Then, data DATA4–DATA7 to be written into the next sector is transferred to the buffer memory 140 (period T5).

When all write data has been transferred from the buffer memory 140 to the flash memory 110, the bit indicating the end of data transfer is set in the status register SR1 in the interface circuit 130. The external host CPU sends a read command of the status register SR1 to find that data has been transferred from the buffer memory. The contents of the status register SR1 are sent to the host CPU via the external terminal 174, via which the command was input, in the time-division manner.

According to the data transfer method in this embodiment, the transfer of data, which is to be written into the next sector, from the external host CPU to the memory card may be started without having to wait until data is written into the flash memory 110. This reduces the overhead time involved in write data transfer and reduces the total write time.

Figure 3:
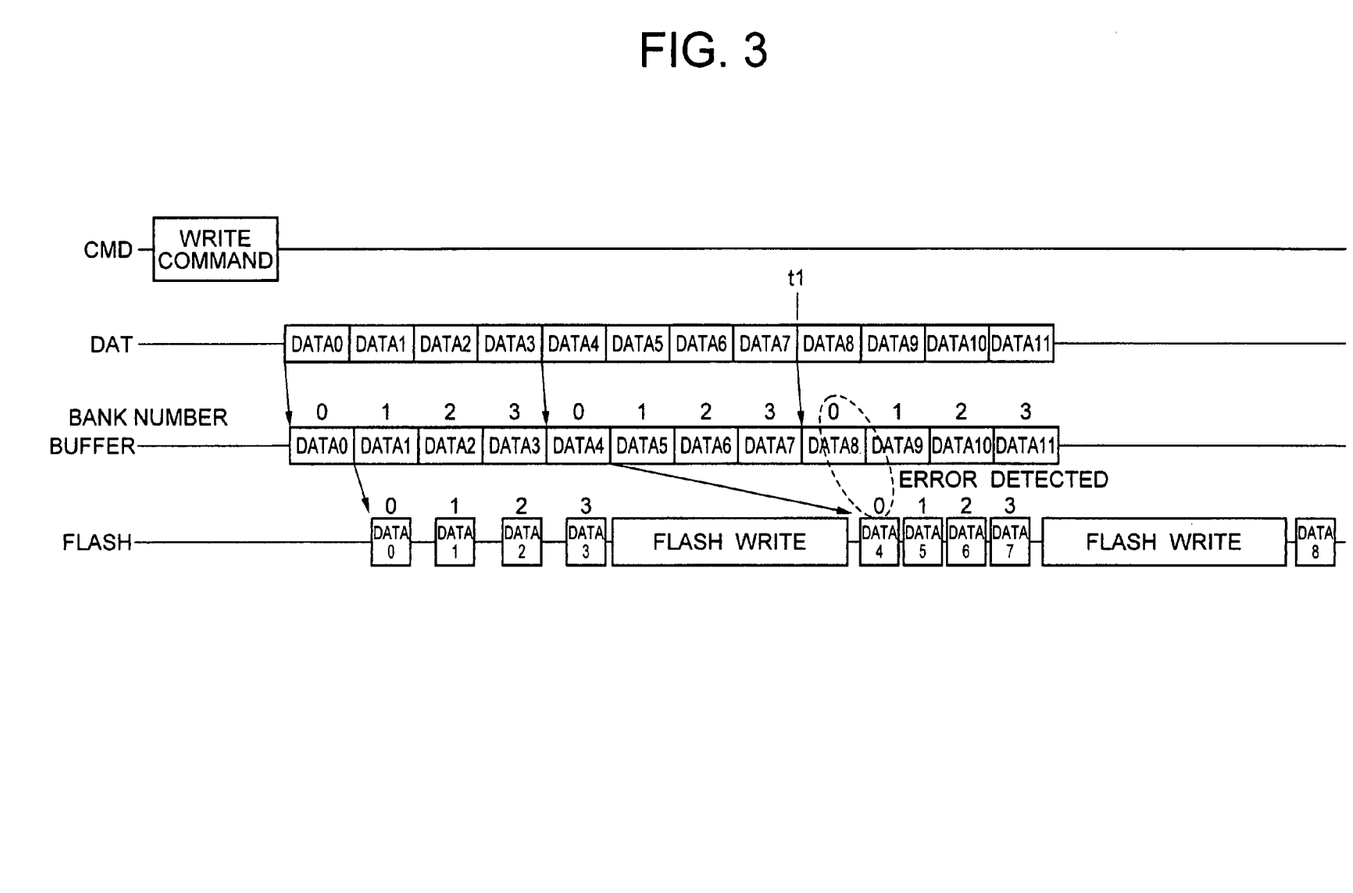
FIG. 3 is a timing diagram showing a second embodiment of write processing on the memory card to which the present invention is applied.

A second embodiment of the write data transfer method for use on the memory card according to the present invention will be described with reference to the timing diagram in FIG. 3.

In the transfer method in the second embodiment, after one sector of data has been transferred to all banks of the buffer memory 140, data to be written into the next sector is immediately transferred without reading status register SR1 to check, as in the first embodiment, if the transfer of data to the flash memory is ended. However, in this case, if the time required to transfer data from the host CPU to the buffer memory 140 is shorter than the time required to write data into the flash memory 110, the time to start the transfer of write data from the host CPU to the buffer memory 140 sometimes arrives before data already stored in the buffer memory 140 is transferred to the flash memory 110 as indicated by code t1 in FIG. 3.

Therefore, when using the transfer method in this embodiment, it is necessary to prevent a data transfer outstrip condition such as the one described above. One example of a data transfer outstrip prevention method will be described with reference to FIGS. 4 and 5.

Figure 4:
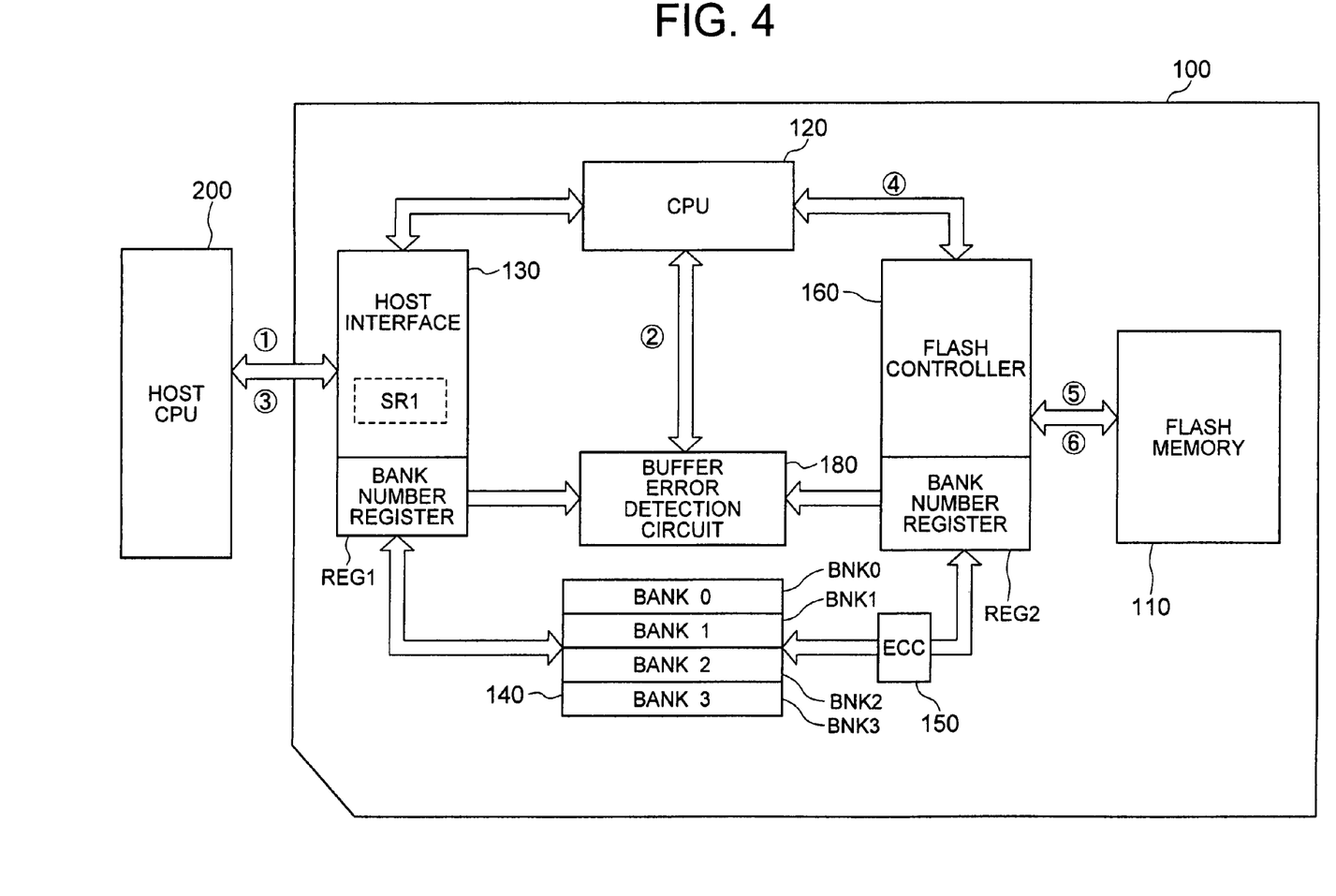
FIG. 4 is a block diagram showing an example of the configuration of hardware that implements the second embodiment of write processing on the memory card to which the present invention is applied.

FIG. 4 shows hardware required for preventing a data transfer outstrip condition. The interface circuit 130 contains register REG1 in which the number of the bank of the buffer memory 140 whose data is being transferred by a host CPU 200 is stored. The flash controller 160 contains register REG2 in which the number of the bank whose data is being transferred from the buffer memory 140 to the flash memory 110 is stored. In addition, a buffer error detection circuit 180 including a comparator comparing the bank numbers of the two registers, REG1 and REG2, is provided. Registers REG1 and REG2 are managed by the interface circuit 130 and the flash controller 160, respectively.

In this embodiment, the buffer error detection circuit 180 outputs a detection signal to the microprocessor 120 when the bank numbers stored in the two registers match. Upon detecting that the transfer of data from the host CPU 200 is made to the bank in use, the microprocessor 120, for example, sets the data transfer error bit in status register SR1 in the interface circuit 130 to inform the host CPU 200 of a data transfer error. The data transfer error bit may also indicate an error other than the data transfer outstrip error (buffer error), or another bit indicating only the buffer error may be provided to distinguish between the buffer error and other data transfer errors.

The host CPU 200 may read the contents of status register SR1 by issuing the read command, as described above, to check if a data transfer error has occurred. Therefore, if a data transfer error occurred, it is necessary to send the write command and transfer write data to start from the beginning.

In general, the time required to write data into the flash memory depends on a sector into which data is to be written or on data that is written. Sometimes, the write time is extremely long. Therefore, even if the host CPU tries to transfer data according to the average flash-memory write time, a buffer error may occur as described above. In this embodiment, information about a data transfer strip may be sent to the host CPU. As a result, this method prevents the host CPU from transferring the next data into a bank before the data in that bank is transferred to the flash memory.

Figure 5:
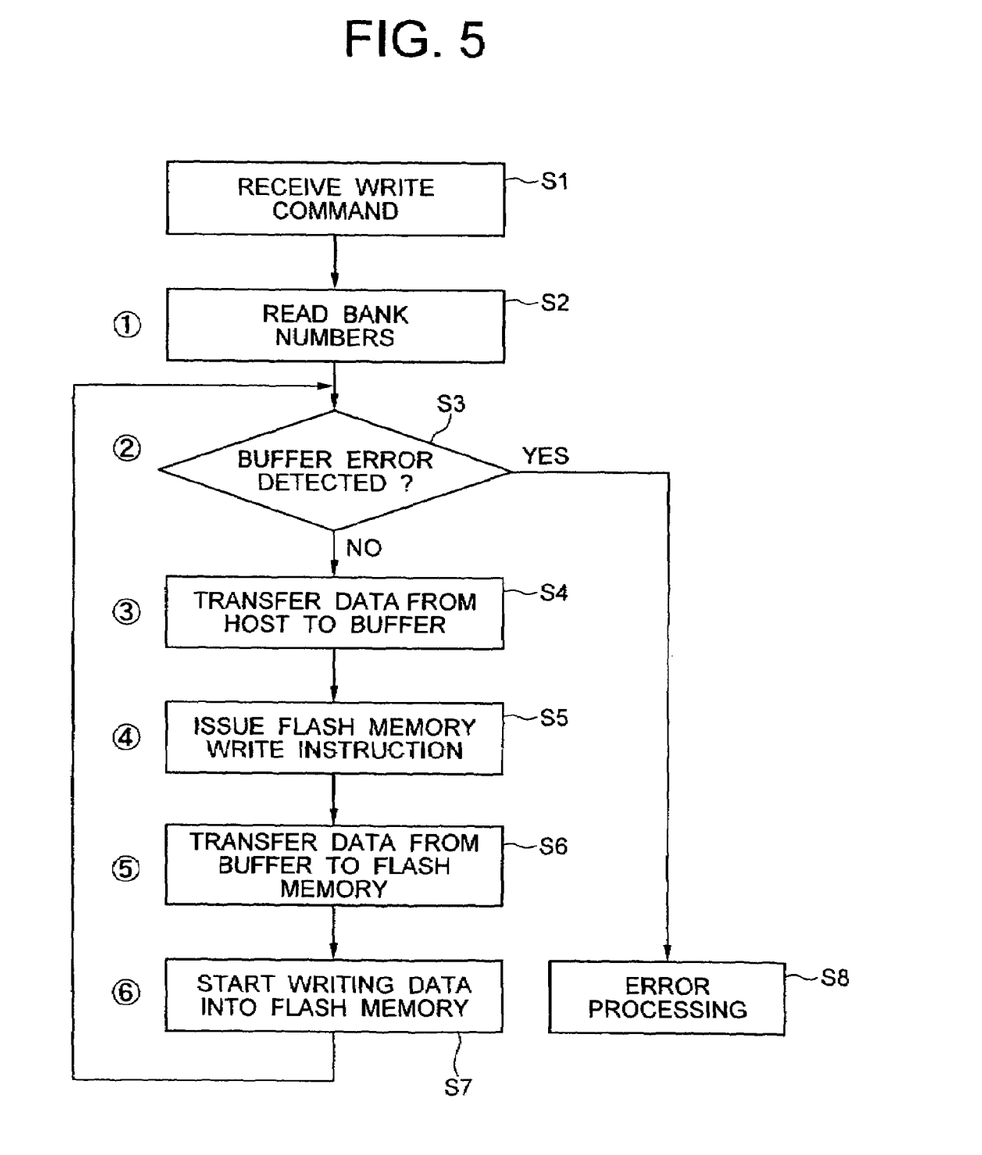
FIG. 5 is a flowchart showing a control procedure used in the second embodiment of write processing on the memory card to which the present invention is applied.

On the memory card in the embodiment in FIG. 4, the buffer error detection circuit 180 is provided to allow the hardware to detect a data transfer outstrip condition. This may also be achieved by the software in the microprocessor 120. FIG. 5 shows an example of the control procedure.

In response to a write command from the host CPU, the microprocessor 120 reads bank numbers from registers REG1 and REG2 and compares them to check if a buffer error has occurred (steps S1–S3). If no error buffer has occurred, write data transferred from the host CPU is stored in the bank of the buffer memory corresponding to the bank number indicated by register REG1 (step S4).

When the bank becomes full, the microprocessor 120 issues a write instruction, which writes data into the flash memory 110, to the flash controller 160 and transfers data from the buffer memory 140 to the flash memory 110 (steps S5 and S6). After that, the microprocessor 120 issues a flash-memory write start instruction to the flash controller 160 and then passes control back to step S3 (step S7). On the other hand, if it is found in step S3 that a buffer error has occurred, the microprocessor 120 passes control to step S8 and performs error processing; for example, it sets the data transfer error bit in the status register SR1 in the interface circuit 130.

This embodiment may be configured, for example, to provide a register, in which information indicating the bank number or transfer data where a buffer error occurred is stored, in the interface circuit 130 to inform the host CPU of the condition. When a buffer error occurs during the data transfer from the host CPU to the memory card, this configuration allows the data transfer to be restarted from the data where an error occurred.

In FIG. 4, register REG1 containing the number of the bank of the buffer memory 140 being used by the host CPU 200 for data transfer is provided in the interface circuit 130, and register REG2 containing the number of the bank to which data is being transferred from the buffer memory 140 to the flash memory 110 is provided in the flash controller 160. The location of those registers is not limited to the configuration described above. Those registers may be provided either as independent circuits or in a part of the microprocessor 120 or the buffer memory 140.

Alternatively, instead of providing registers REG1 and REG2, two flags may be provided for each bank, one indicating that data is being transferred between the host CPU and the buffer memory and the other indicating that data is being transferred between the buffer memory and the flash memory, to detect a buffer error based on the state of those flags. In addition, a register containing the number of a bank that causes a buffer error may be provided in the interface circuit 130 so that the external host CPU may read it.

Figure 6:
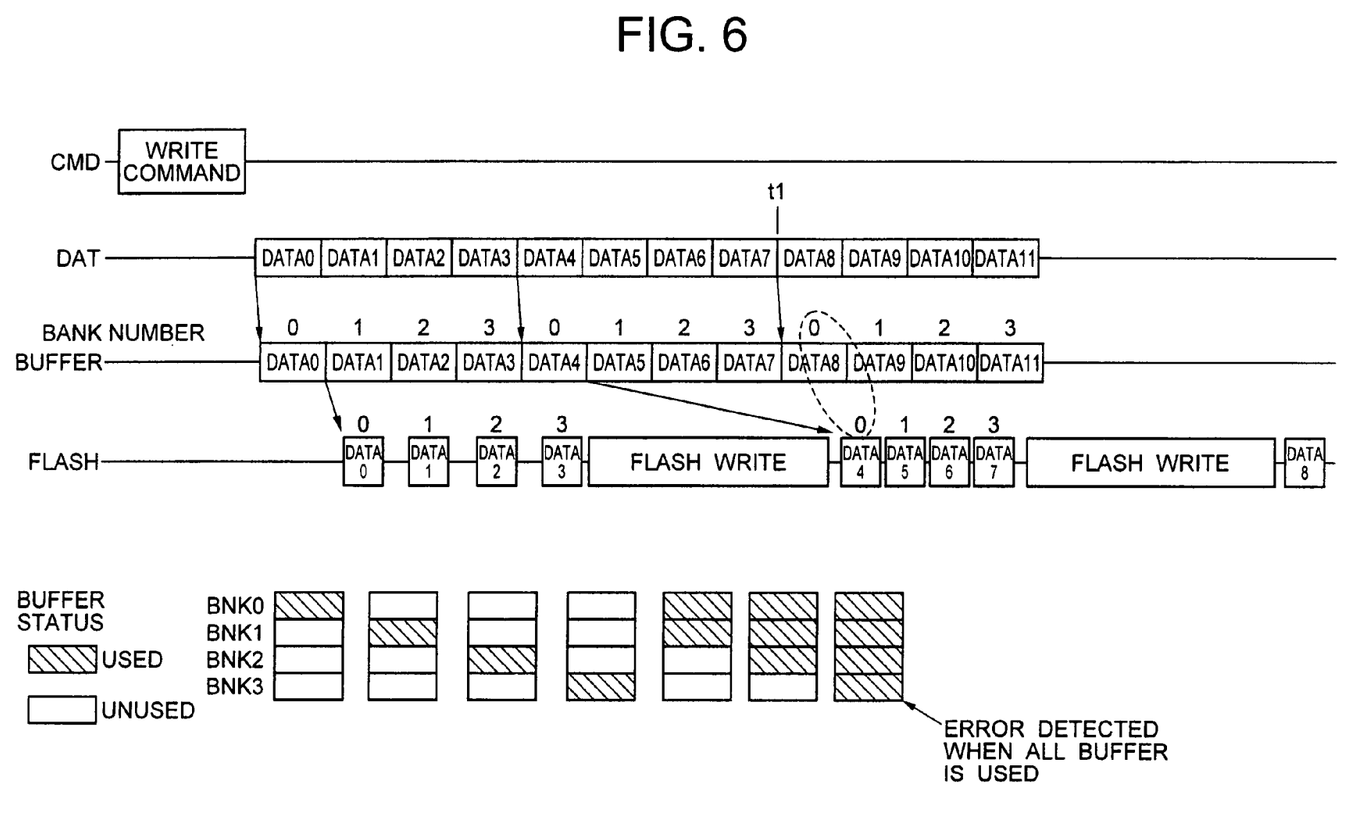
FIG. 6 is a timing diagram showing a third embodiment of write processing on the memory card to which the present invention is applied.

A third embodiment of the write data transfer method for use on the memory card according to the present invention will be described with reference to the timing diagram in FIG. 6.

The transfer method in the third embodiment is similar to that in the second embodiment. That is, after data DATA0–DATA3 has been transferred to all banks BNK0–BNK43 of the buffer memory 140, data, DATA4–DATA7, to be written into the next sector is immediately transferred without checking if data has been transferred from the buffer memory 140 to the flash memory 110. The difference from the transfer method in the second embodiment is that a buffer error occurs when an attempt is made to transfer the next data if all banks contain data not yet transferred as shown in the buffer memory status diagram at the bottom of FIG. 6 (timing t2). In the buffer memory status diagram at the bottom of FIG. 6, a shaded bank indicates that data from the host CPU is stored but the data is not yet transferred to the flash memory.

Figure 7:
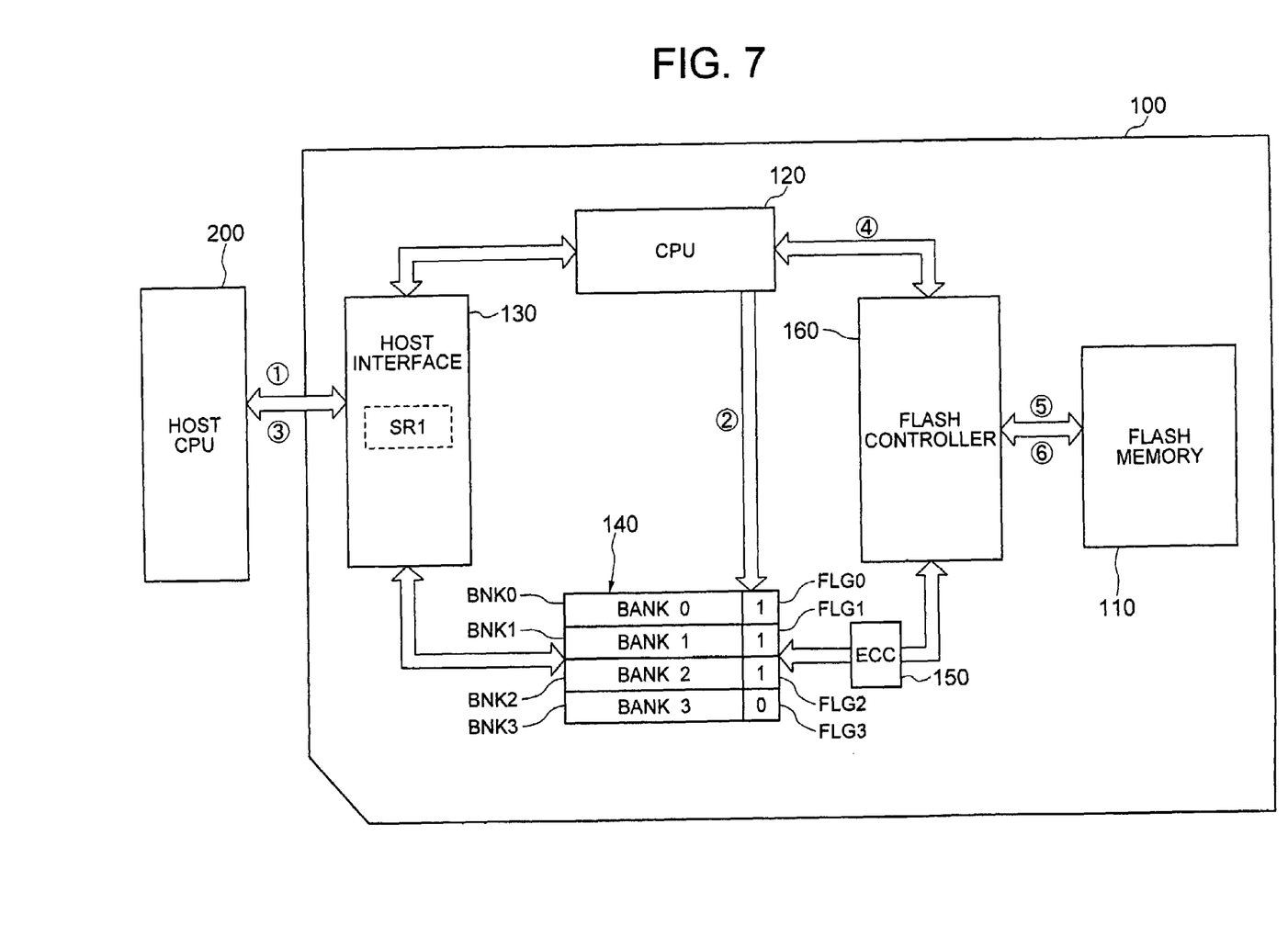
FIG. 7 is a timing diagram showing a fourth embodiment of write processing on the memory card to which the present invention is applied.

FIG. 7 shows hardware required when the transfer method in the third embodiment is applied. In this embodiment, flags FLG0–FLG3, each corresponding to banks BNK0–BNK3 in the buffer memory 140, are provided. Each flag is set to "1" when the host CPU 200 stores data in the corresponding bank, and is cleared to "0" when the stored data is transferred to the flash memory 110. Therefore, regardless of whether data is actually stored in the bank, the bank is free if the flag is "0" and is able to receive the next write data.

In this embodiment, the method described below is used although the present invention is not limited to this method. That is, the flag of a bank into which the interface circuit 130 is going to store data during the transfer of data from the host CPU 200 to the buffer memory 140 is set to "1" and the flag is cleared to "0" when the microprocessor 120 has transferred one bank of data from the buffer memory 140 to the flash memory 110.

The control procedure of the microprocessor 120 used for data transfer in this embodiment is almost the same as the flowchart shown in FIG. 5. The only difference is that, in step S2, flags FLG0–FLG3 in the buffer memory 140 are read instead of reading a bank number from the register and that, in step S3, it is determined that a buffer error has occurred, not when the bank numbers match, but when flags FLG0–FLG3 all contain "1".

Instead of providing the flags, it is also possible to provide a register, which contains the number of a bank to which data has been transferred from the host CPU, may be provided. When data has been transferred from the bank to the flash memory, the bank number is deleted from the register. Based on the contents of this register, a check is made to see if a buffer error has occurred.

Next, a fourth embodiment of the write data transfer method for use on the memory card according to the present invention will be described with reference to the block diagram in FIG. 8 and the flowchart in FIG. 9.

The method in this embodiment prevents a flash memory write failure or a flash memory overflow from being generated because of an address error when data is written into the flash memory 110 using a write command and write data sent from the host CPU. That is, as described in the embodiments described above, when the write address attached to the write command sent from the host CPU is out of the allowable address range of the flash memory 110 or, for example, when more than one sector of write data is sent from the host CPU following the write address specifying the last sector in the flash memory, a flash memory overflow occurs and data cannot be written. The object of this embodiment is to prevent this error.

Figure 8:
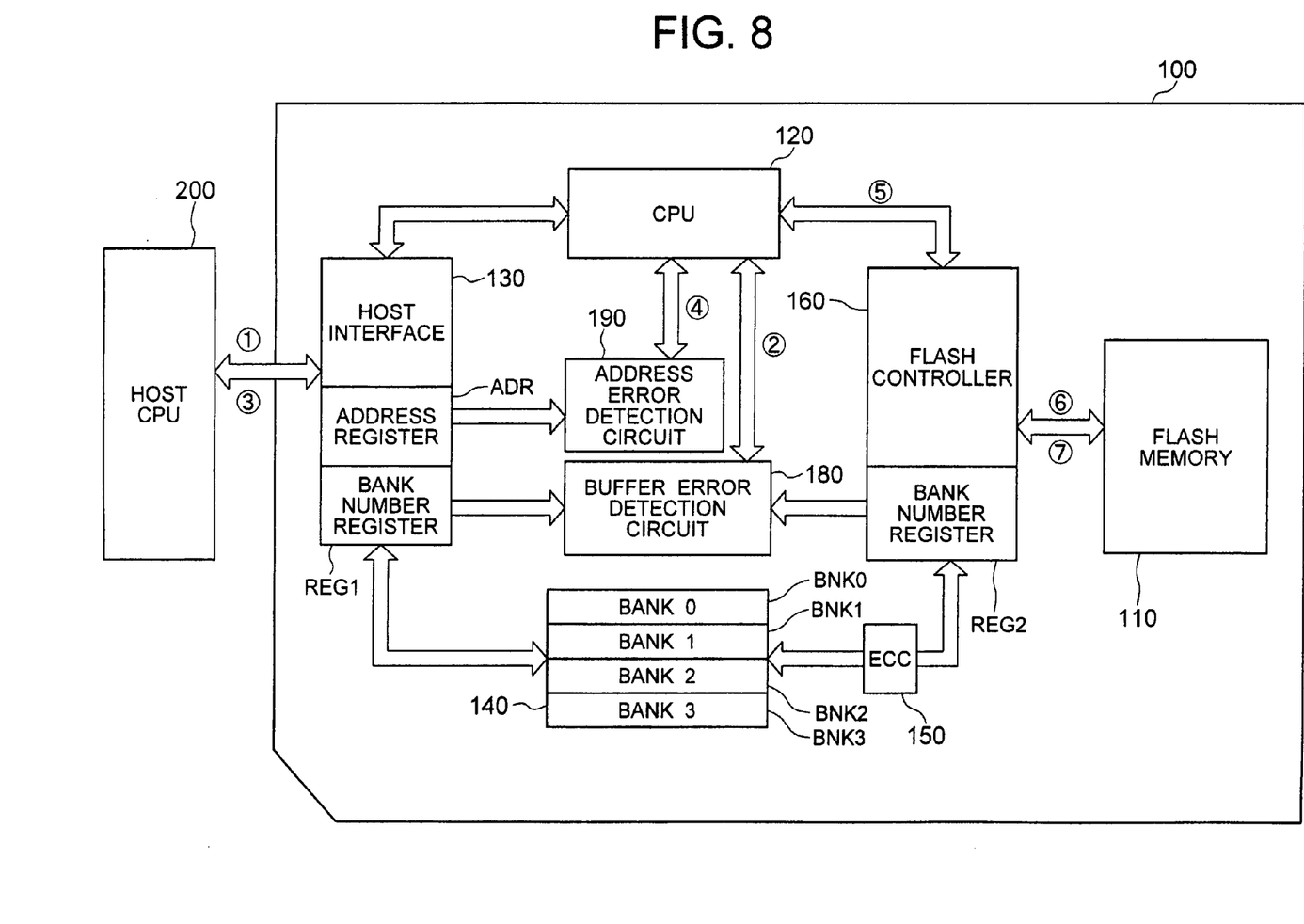
FIG. 8 is a block diagram showing an example of the configuration of hardware that implements the fifth embodiment of write processing on the memory card to which the present invention is applied.

To achieve the above object, the memory card in this embodiment has an address setting register ADR and an address error detection circuit 190 as shown in FIG. 8. The address setting register ADR is provided in the interface circuit 130 to contain the address range of the flash memory. The address error detection circuit 190 compares a physical address generated by the microprocessor 120 by converting a logical address supplied from the host CPU or an address updated by the microprocessor 120 according to the transfer data amount with the address stored in the address setting register ADR.

The address setting register ADR described above may be provided, not in the interface circuit 130, but as an independent circuit or in the flash controller 160 or microprocessor 120. Although, in FIG. 8, the memory card in this embodiment is combined with the memory card in the embodiment in FIG. 4, that is, the memory card has REG1 and REG2 containing the numbers of the banks from or to which data is being transferred and the buffer error detection circuit 180 are provided, this embodiment may be independent of the embodiment in FIG. 4. That is, registers REG1 and REG2 and the buffer error detection circuit 180 shown in FIG. 8 may be omitted.

The data transfer control procedure for use with a memory card using the data transfer method in this embodiment will be described with reference to the flowchart in FIG. 9. This control procedure is the same as that shown in FIG. 5. The only difference is that step 9, in which a check is made for an address error, is inserted between step S4 and step S5 in FIG. 5 and that, if an address error is generated, control is passed to error processing S8 in which a predetermined error bit in status register SR1 in the interface circuit 130 is set.

Figure 9:
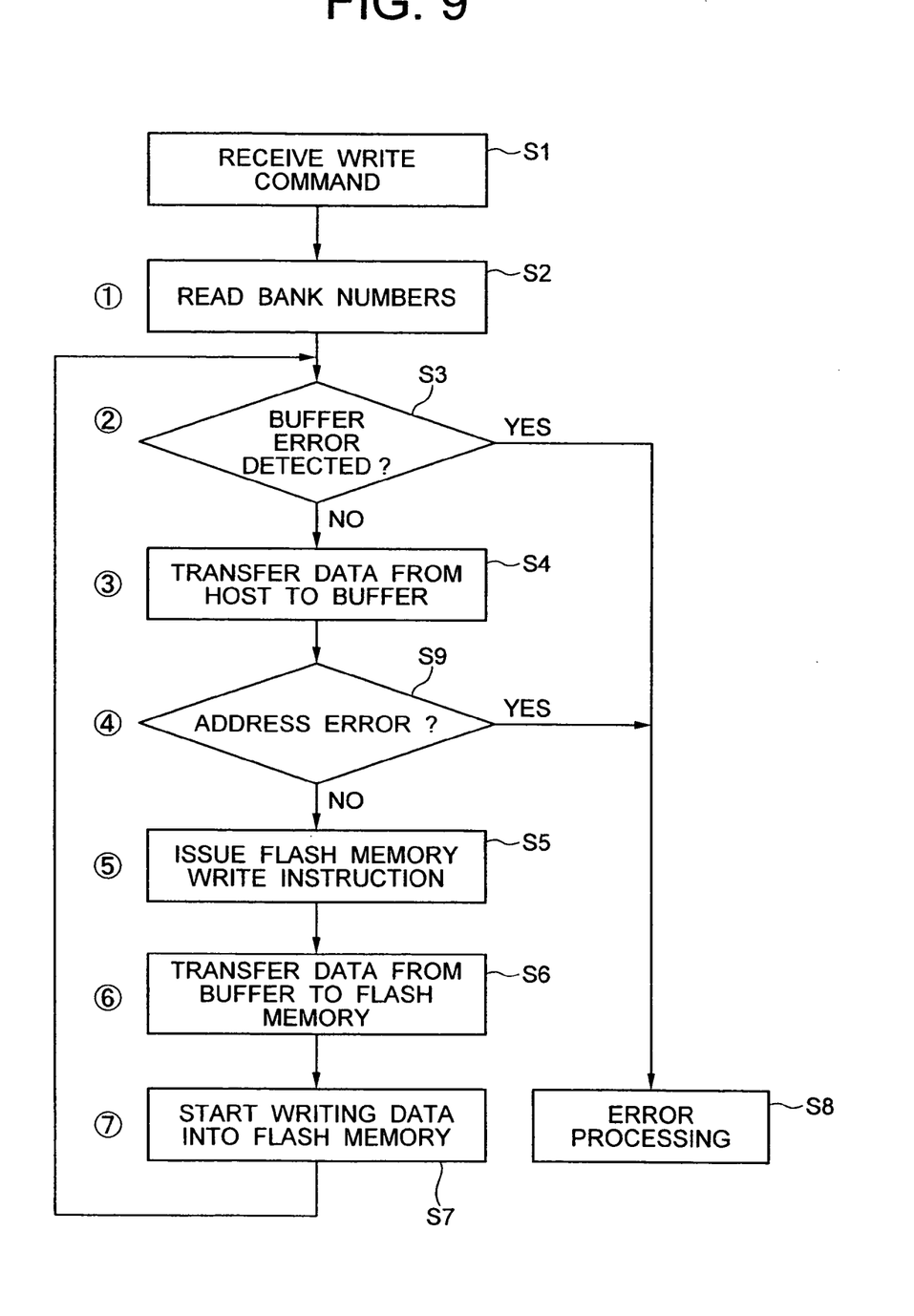
FIG. 9 is a flowchart showing a control procedure used in the fifth embodiment of write processing on the memory card to which the present invention is applied.

The address error check in step S9 in FIG. 9 may be made based on the signal from the address error detection circuit 190. It is also possible for the microprocessor 120 to make the address error check on a software basis, based on the address that is set in the address setting register ADR, with no address error detection circuit 190 provided.

Figure 11:
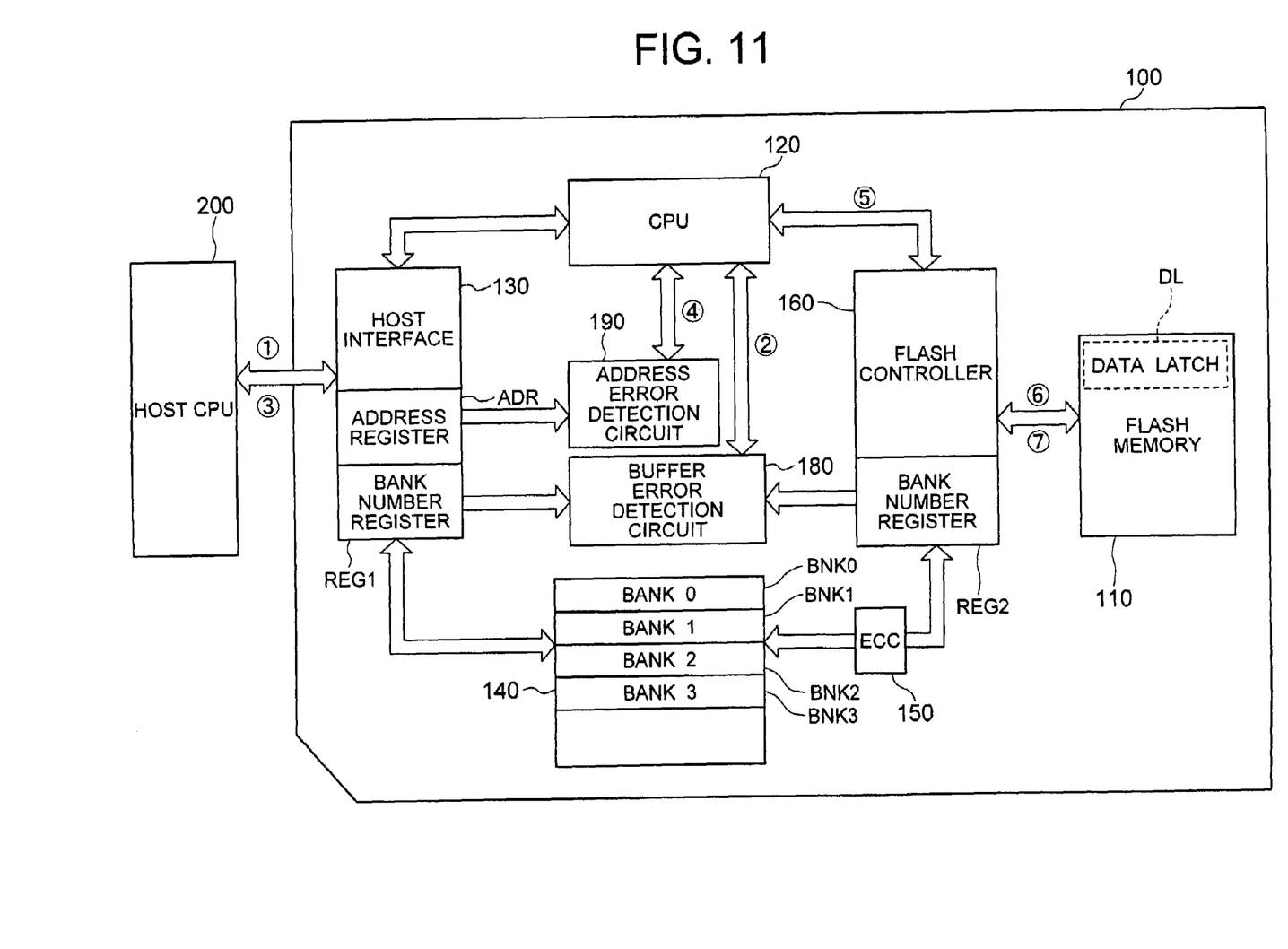
FIG. 11 is a block diagram showing an operation performed when a write error occurs on a memory card using a flash memory that has a data latch holding write data.

Next, the operation will be described that is performed when a write error occurs during the write operation in the flash memory 110 on the memory card in the embodiment shown in FIG. 11. After data is transferred from the buffer memory 140 to the flash memory 110, the next write data is transferred to, and stored in, the buffer memory 140. However, after the next write error is transferred, if a write error occurs in the flash memory 110, it is likely that the write data, for which the write error occurred, has already been deleted from the buffer memory 140.

In this case, the write data which is stored in the data latch DL in the flash memory 110 and for which the write error occurred is read into an area other than bank 0–bank 3 of the buffer memory 140, substitute processing is performed by specifying an alternate address in the flash memory 110 other than the address where the error occurred, and then the write error which has been read into the buffer memory 140 and for which the write error occurred is stored again at the alternate address. After data is stored in the alternate address, the next write data stored in bank 0–bank 3 of the buffer memory 140 is stored. This method eliminates the need for transferring again the write data that was transferred from the host CPU 200.

Although the present invention made by the inventors has been described in the embodiments, it is to be understood that the present invention is not limited to the embodiments described above but may be changed in various ways without departing from the spirit of the present invention. For example, although the buffer memory 140 in the above embodiments includes four banks, the number of banks is not limited to four but any number of buffers may be used. In addition, although the buffer memory 140 may include one semiconductor memory, it may also include a plurality of semiconductor memories. In this case, one semiconductor memory may be made correspond to one bank. In addition, the buffer memory 140 larger than one sector of flash memory 110 may be used, to allow a non-bank area to be used as the work area of the microprocessor 120.

In the above description, the invention made by the inventors is described primarily for flash memory and a memory card containing a flash memory that is in the background field of the invention. However, the present invention is not limited to the memory card described above. The present invention may be applied also to EEPROM chips, other non-volatile memories, memory cards containing such memories, and a memory module including a board on which a plurality of non-volatile memory chips are mounted.

That is, in a card storage device containing a non-volatile memory and a buffer memory according to the described embodiments, the buffer memory includes a plurality of banks. Data is transferred sequentially from a host CPU to the banks of the buffer memory, data is transferred to the non-volatile memory from a bank that becomes full, the write operation is started when one unit of data to be written into the non-volatile memory at a time has been transferred and, without waiting for the data to be written, the next write data is transferred from the host CPU to a bank from which write data has been transferred. This method reduces the write data transfer overhead and reduces the time required for writing data.

It should be further understood by those skilled in the art that the foregoing description has been made on embodiments of the invention and that various changes and modifications may be made in the invention without departing from the spirit of the invention and the scope of the appended claims.

What is claimed is:

1. A nonvolatile storage device comprising:
   a controller;
   a buffer memory, wherein said buffer memory comprises a plurality of banks;
   a nonvolatile memory, wherein an amount of data storable into said nonvolatile memory at one time is equal to an amount of data that can be stored in a plurality of said banks of said buffer memory,
   wherein said controller performs control operations to receive data from outside of said nonvolatile storage device via a data terminal, to store received data to said banks of said buffer memory, and to transfer received data from said banks of said buffer memory to said nonvolatile memory,
   wherein said controller also detects whether received data has been transferred from each bank of said buffer memory to said nonvolatile memory, performs control operations to select, for storing further received data, one of said banks of said buffer memory that is not storing received data yet to be transferred to said nonvolatile memory, and performs control operations to issue a program command to said nonvolatile memory when said controller controls transfer of the amount of data to said nonvolatile memory, and wherein said controller further provides a signal, as status information, to the outside of said nonvolatile storage device when said controller detects that all of said banks of said buffer memory are storing received data yet to be transferred to said nonvolatile memory;

a status register including a status flag used for providing a state indication which indicates whether a transfer of data from said buffer memory to said nonvolatile memory has been completed, wherein said status flag is set by said controller, and said controller is capable of outputting said state indication as said status information, wherein said status flag includes a plurality of bits respectively corresponding to said plurality of banks of said buffer memory, and each of said bits indicates whether transferring of data from the corresponding bank of said buffer memory to said nonvolatile memory has been completed;

a first register containing information which indicates whether each of said banks of said buffer memory is storing received data; and a second register containing information which indicates whether received data stored in each of said banks of said buffer memory has been transferred to said nonvolatile memory, wherein said controller judges whether each of said banks of said buffer memory stores received data yet to be transferred to said nonvolatile memory, based on information contained in said first register and information contained in said second register, for setting each of said bits of said status flag.

2. A nonvolatile storage device according to claim 1, further comprising:

a register in which an address range of said nonvolatile memory is set; and a data storage error detection circuit which detects whether data may be written to said nonvolatile memory, based on the address information that is set in said register and an amount of data that is received from the outside.

3. A nonvolatile storage device according to claim 1, wherein a total storage size of all banks of said buffer memory equals a size of a unit of data that is written into said nonvolatile memory at a time.

* * * * *